United States Patent [19]

Tam et al.

[11] Patent Number: 4,673,982
[45] Date of Patent: Jun. 16, 1987

[54] MULTIPLE FREQUENCY ADAPTIVE NOISE FILTER FOR REMOVING INTERFERENCE SIGNALS FROM A FREQUENCY BAND HAVING A DESIRED SIGNAL

[75] Inventors: Le Dinh C. Tam, Brossard; Roger Garceau, Pierrefonds; Andre Leblanc, Laval; all of Canada

[73] Assignee: Centre de Recherche Industrielle du Quebec, Quebec, Canada

[21] Appl. No.: 657,525

[22] Filed: Oct. 4, 1984

[51] Int. Cl.[4] ............................................. H04N 5/21
[52] U.S. Cl. ................................. 358/167; 358/166; 358/905; 455/295
[58] Field of Search ................... 358/167, 166, 36, 37, 358/905; 455/213, 222, 295, 296, 303, 307; 333/165, 164, 174

[56] References Cited

U.S. PATENT DOCUMENTS 4,458,269  7/1984  Schroeder ......................... 358/167
4,502,077  2/1985  Morotomi ......................... 358/905

OTHER PUBLICATIONS

Adaptive Noise Cancelling: Principles and Applications, by B. Widrow, Proceedings of the IEEE, vol. 63, No. 12, Dec. 1975, pp. 1692-1716.

Primary Examiner—Tommy P. Chin
Attorney, Agent, or Firm—Oblon, Fisher, Spivak, McClelland & Maier

[57] ABSTRACT

A multiple frequency adaptive filter system for filtering undesired periodic and/or correlated interference signals contained in the same frequency band as a desired input signal. The filter system is capable of filtering at least two sinusoidal interference signals and incorporates a negative feedback loop having a transfer function of that of narrow band-pass multiple filter. The feedback loop using interference frequencies generates a corresponding interference enhanced output signal. This enhanced output signal is combined with the input signal whereby to produce an error signal which corresponds to the desired signal contained in the input frequency band. A double or quadruple filter system is also described as examples of the present invention. The filter system is suitable for removing modulated sinusoidal interference and particularly for reducing TV co-channel interference.

12 Claims, 10 Drawing Figures

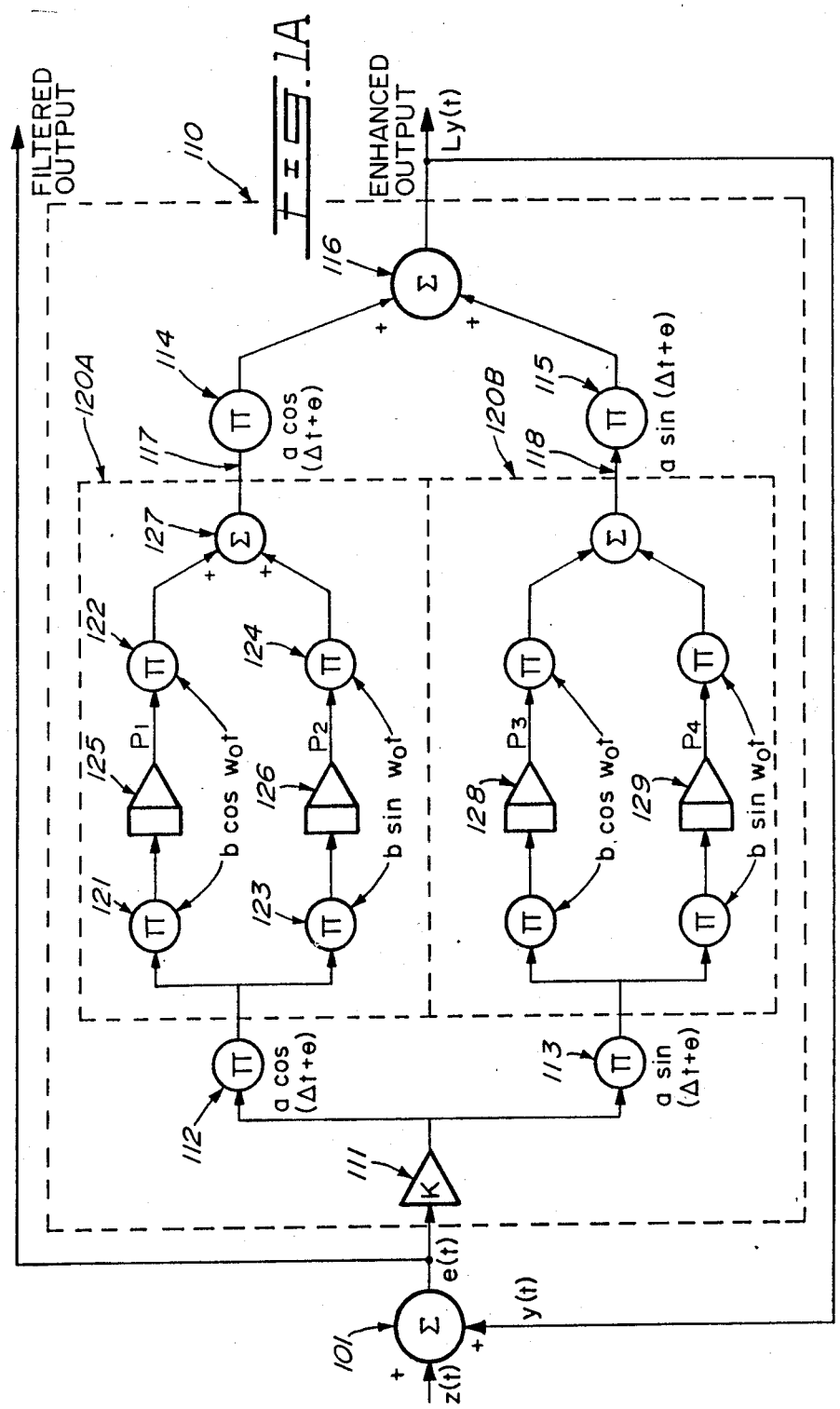

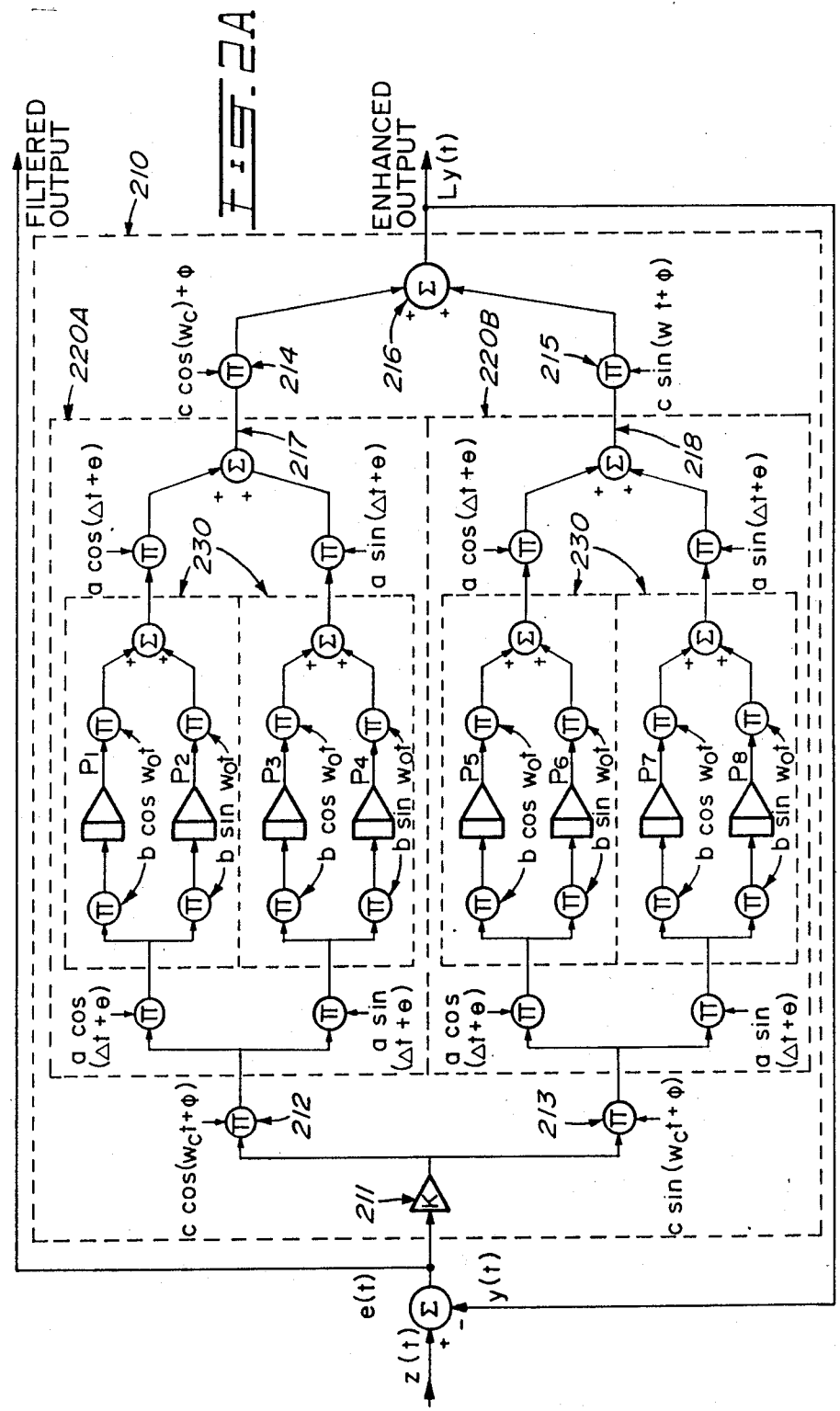

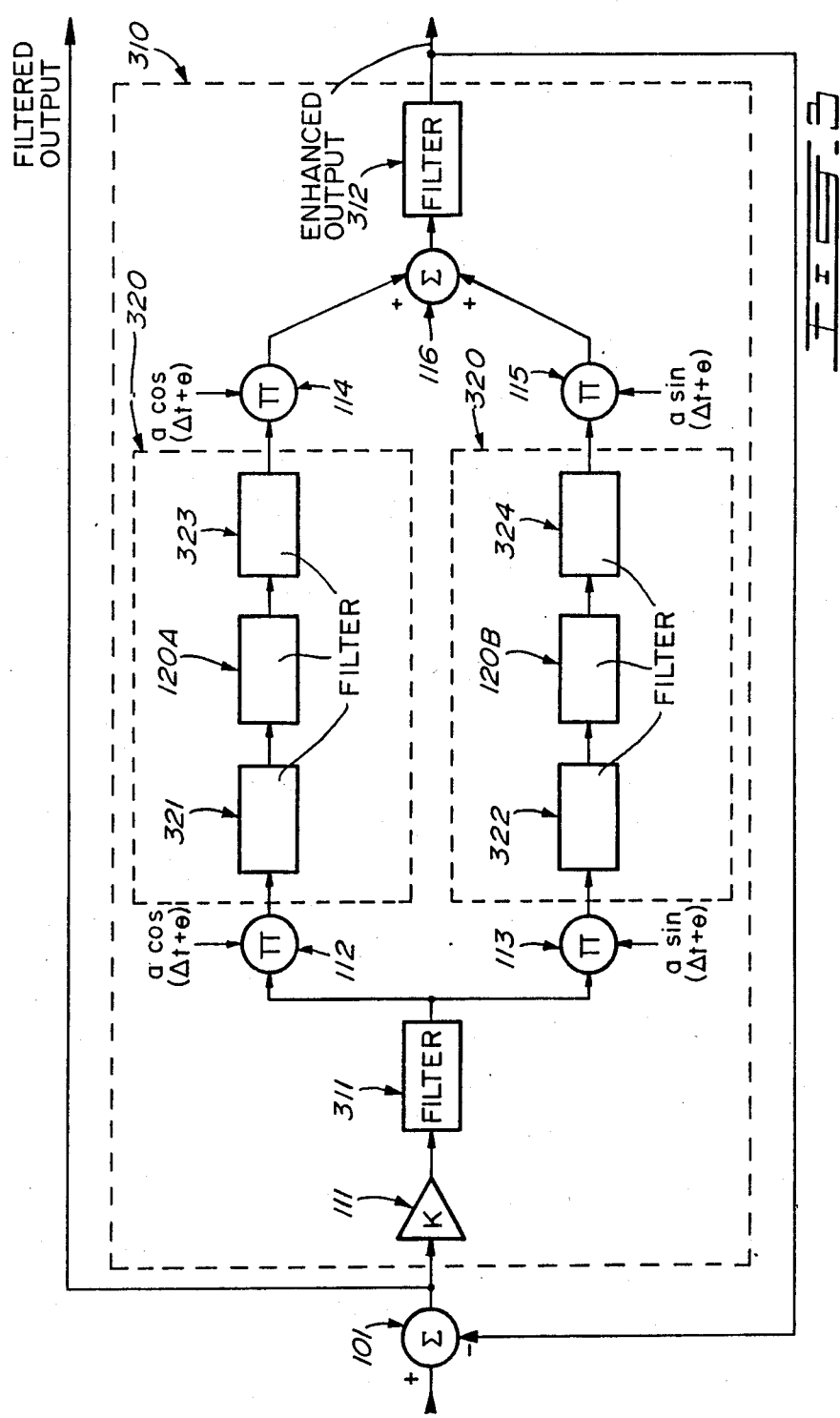

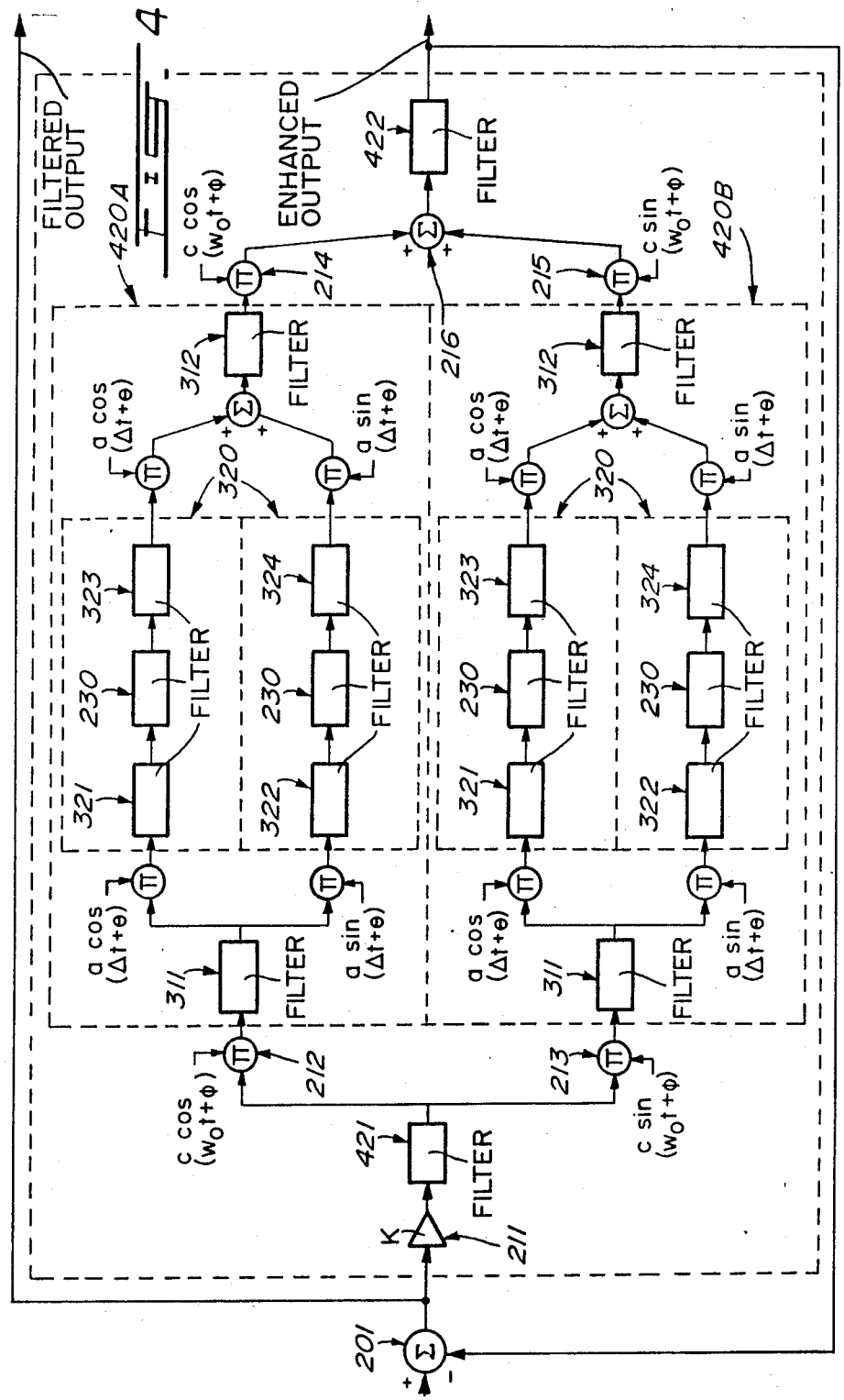

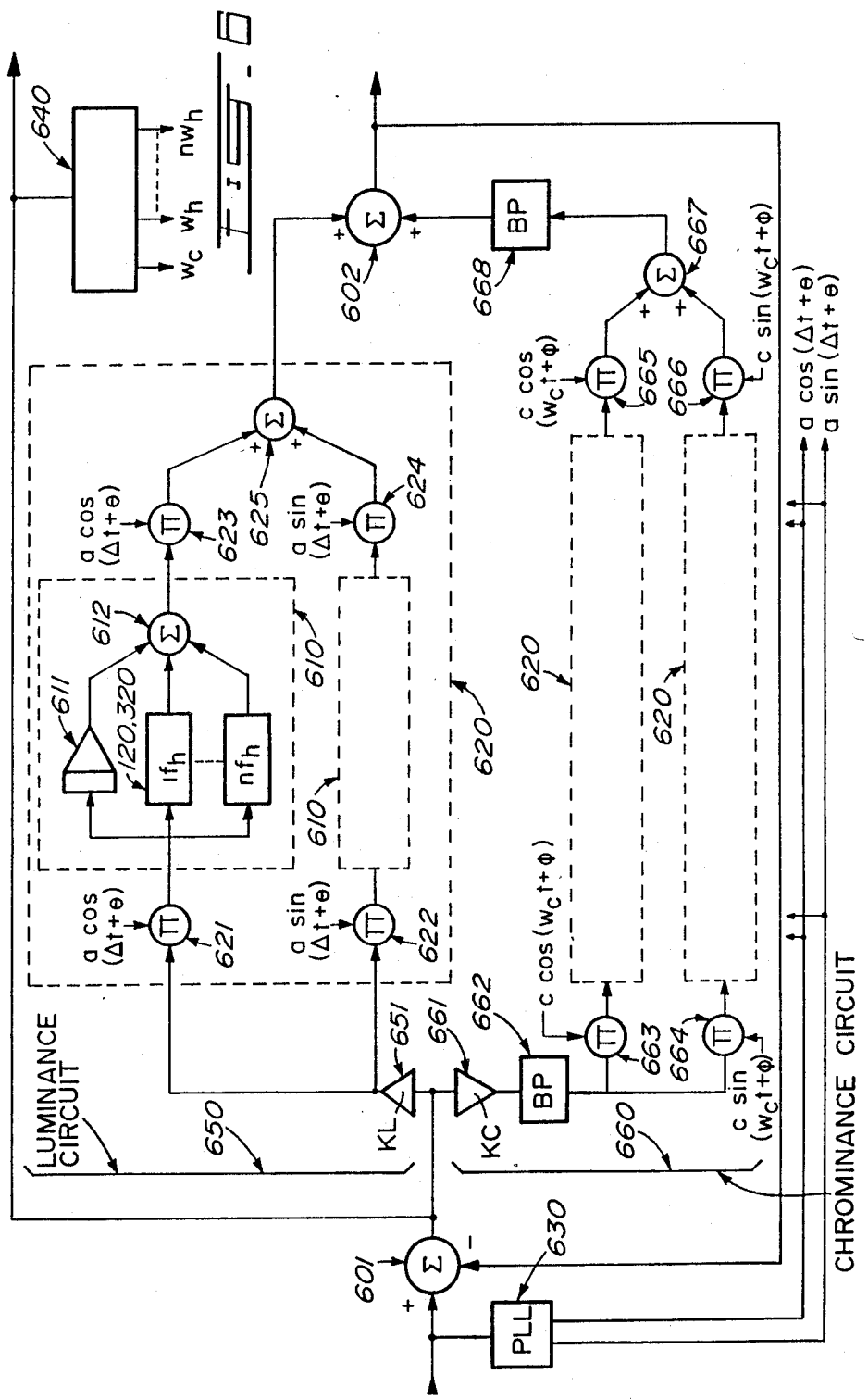

MULTIPLE FREQUENCY ADAPTIVE NOISE FILTER FOR REMOVING INTERFERENCE SIGNALS FROM A FREQUENCY BAND HAVING A DESIRED SIGNAL

BACKGROUND OF INVENTION (a) Field of the Invention

The present invention relates to a multiple frequency adaptive filter for removing undesired periodic and/or correlated interference signals contained in the same frequency band as a desired input signal.

(b) Description of Prior Art

In recent years, many different circuits or systems have been proposed for separating, enhancing, or cancelling noise, intersymbol interference, echo, or different signal frequencies affecting a desired signal. These prior art systems, particularly in the time domain, such as described in U.S. Pat. No. 4,052,559 to Paul et al and U.S. Pat. No. 4,238,746 to McCool et al, each teach the use of an adaptive transversal filter whose weight vector is governed by the Widrow-Hoff algorithm, a real time least mean square approximation to the Weiner-Hoff filter. Reference is herein made to Proceedings of the IEEE, Vol. 63, No. 12, December 1975, pp. 1692-1716, "Adaptive Noise Cancelling" by Widrow et al.

Further adaptive cancelling can also be performed in the frequency domain. Also, when the interference is simply a sinusoidal signal of known frequency, Widrow suggests the use of a pair of in-phase/in-quadrature signals to track the amplitude and phase of a sinusoidal interference in place of an adaptive transversal filter. Widrow's adaptive notch filters can be used in series or parallel combination for the case of multiple sinusoidal interferences whose frequencies are individually known.

SUMMARY OF INVENTION

A feature of the present invention is to provide a multiple frequency adaptive filter system which is capable of removing at least two sinusoidal interference signals contained in an input signal.

Another feature of the present invention is to provide a multiple frequency adaptive filter system capable of removing undesirable inteference signals located inside a frequency band containing the desired signal.

According to the above features, from a broad aspect, the present invention provides a multiple frequency adaptive filter system capable of removing at least two sinusoidal interference signals contained in the same frequency band as a desired input signal. The system comprises a negative feedback circuit whose transfer function is that of a narrow band-pass filter. The feedback circuit generates a signal which is a reproduction of the frequency band having the interference signal therein. This signal is fed back to an adder circuit which combines it with the input signal whereby to generate an error signal which is, in fact, the desired signal.

According to a preferred embodiment of the present invention, the multiple frequency adaptive filter system is constituted by a multiple frequency adaptive filter capable of filtering two sinusoidal interferences by using the mean frequency and a frequency which is half of the difference between their actual frequency.

In another preferred embodiment of the present invention, the multiple frequency adaptive filter system is constructed such as to remove four interference signals symmetrical in the frequency domain by utilizing only three of the specific frequencies of these signals.

According to another example of the preferred embodiment of the present invention, there is provided a multiple frequency adaptive filter system capable of removing sinusoidal modulated interference signals and more particularly, television co-channel interference.

BRIEF DESCRIPTION OF DRAWINGS

Examples of the preferred embodiment of the present invention will now be described with reference to the accompanying drawings, in which:

FIG. 1a is a block diagram of the double frequency adaptive filter system of the present invention;

FIG. 2a is a block diagram of a quadruple adaptive filter system to remove four parasitic sinusoidal signals, in accordance with the method of the present invention;

FIG. 2b is a graph illustration of the transfer function spectrum of the filter output signal at the output of FIG. 2a;

FIG. 2c is a graph illustration of the transfer function spectrum of the enhanced output signal at the output of FIG. 2a;

FIG. 3 is a block diagram illustrating optional filters in the negative feedback loop of the double adaptive filter system;

FIG. 4 is a block diagram illustrating optional filters in the negative feedback loop contained in the quadruple adaptive filter system;

FIG. 6 is a block diagram of the adaptive filter system of the present invention utilized for removing TV co-channel interference in a video system.

DESCRIPTION OF PREFERRED EMBODIMENTS

Figure 1B:
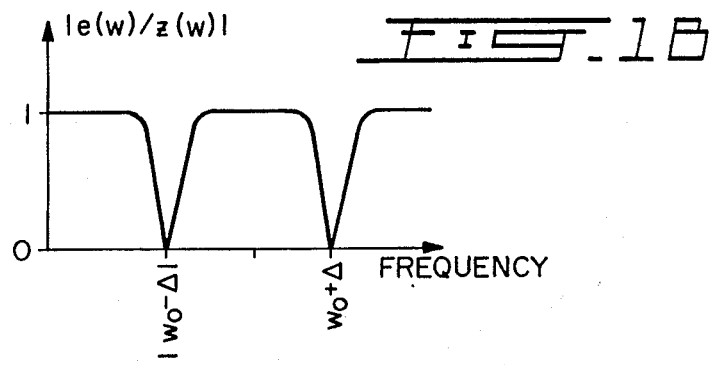
FIG. 1b is a graph illustrating the transfer function spectrum of the output filter signal.

Referring now to the drawings, and more particularly to FIG. 1, there is illustrated the various circuit components which constitutes the dual frequency adaptive filter system of the present invention. As herein shown, the input signal z(t) contains two undesired sinusoids of respective frequencies $(w_o + \Delta)$ and $|w_o - \Delta|$ expressed in radians per second. Let us assume also that $w_o$ is greater than $\Delta$, the frequencies $w_o$ and $2\Delta$ can be respectively considered as the mean and the difference between the two sinusoidal frequencies. For any practical purpose, it is assumed further that the frequencies $w_o$ and $\Delta$ are individually known.

Generally, the multiple frequency adaptive filter system of the present invention is constituted by a negative feedback loop circuit which removes or enhances two sinusoidal signals by using their mean frequency and half of their difference frequency. This negative feedback circuit is illustrated by reference numeral 110 in FIG. 1 and generates an output signal y(t) which is enhanced and which feeds, together with the input signal z(t) a subtractor/combiner circuit 101. The circuit 101 generates an error output signal e(t) which corresponds to the filtered output signal and which feeds an amplifier 111 which adjust the gain of the control loop. This gain K is expressed in radian·second$^{-1}$·volt$^{-4}$.

The amplified signal from the amplifier 111 is applied to both of the multipliers 112 and 113. The other inputs, feeding the multipliers, are respectively signals expressed as a cos $(\Delta t + \theta)$ and a sin $(\Delta t + \theta)$, a pair of phase/quadrature signals. Parameter "a" is expressed in volts and is the amplitude of these signals; while "$\theta$" is expressed in radians and is an initial arbitrary phase.

The outputs from multipliers 112 and 113 are connected to the respective inputs of two identical circuit blocks numbered 120a and 120b. In order to simplify the present description, only one of these blocks will be described. The output signal from the multiplier 112 is applied to the input of block 120a and it is firstly demodulated by the multipliers 121 and 123 by the pair of phase/quadrature signals b cos $w_o t$ and b sin $w_o t$. The parameter "b" designated in volts is the signal amplitude. The two demodulator output signals are now averaged by the respective integrators 125 and 126. The integrator output signals $p_1$ and $p_2$ are remodulated, respectively, by the b cos $w_o t$ signal and the b sin $w_o t$ signal via the multipliers 122 and 124. The resultant signals are then combined in the adder circuit 127.

It is noted that in the second block 120b, the output signals of the two integrators 128 and 129 are denoted respectively by reference numerals $p_3$ and $p_4$.

The signals 117 at the output of the combiner 127 are multiplied by the signal a cos $(\Delta t + \theta)$ in the multiplier 114 while the signal 118 at the output of the other second block circuit 120b is multiplied by the signal a sin $(\Delta t + \theta)$ in the multiplier 115. The output signals from the multipliers 114 and 115 are then added in the combiner 116 wherein an enhanced output signal is provided and herein identified by y(t). It is interesting to note that since the operations of the multipliers are associative, the two frequencies $w_o$ and $\Delta$ are fully interchangeable. Also, when the input signals a sin $(\Delta t + \theta)$ are said to be zero and the input signals a cos $(\Delta t + \theta)$ are 1 volt, the double adaptive filter system is reduced to a single frequency $(w_o)$ Widrow's filter. This double adaptive filter can be implemented by digital and/or analogue techniques. In many practical situations, the integrators are preferably imperfect i.e. RC integrator type, to avoid eventual instability.

It is pointed out that the double filtration filter system of the present invention, as shown in FIG. 1, is governed by the following equations:

$$e(t) = z(t) - ab \sum_{i=1}^{2} p_i(t) r_i(t) \quad (1)$$

$$\dot{p}_i(t) = Kab \, e(t) r_i(t) \quad (2)$$

in which the four reference functions $r_i(t)$ are defined by:

$r_1(t) = \cos(\Delta t + \theta) \cos w_o t$ $r_2(t) = \cos(\Delta t + \theta) \sin w_o t$ $r_3(t) = \sin(\Delta t + \theta) \cos w_o t$ $r_4(t) = \sin(\Delta t + \theta) \sin w_o t \quad (3)$ By taking four times the derivative of equation (1) and using equations (2) and (3) in an appropriate manner, we yield the following equations:

$$\frac{E(s)}{Z(s)} = \frac{[s^2 + (\Delta + w_o)^2][s^2 + (\Delta - w_o)^2]}{D(s)} \quad (4)$$

$$D(s) = s^4 K a^2 b^2 s^3 + 2(\Delta^2 + w_o^2)s^2 + \quad (5)$$

$$K a^2 b^2 (\Delta^2 + w_o^2)s + (\Delta + w_o)^2(\Delta - w_o)^2$$

in which E(s) and Z(s) denote respectively the Laplace transform of e(t) and z(t). Stability of the proposed dual function adaptive filter can be easily shown using the Routh-Hurwitz techniques.

$$K^2 a^4 b^4 << 8(\Delta^2 + w_o^2) \quad (6)$$

Then equation (4) can thus be factorized to $$\frac{E(s)}{Z(s)} \approx \frac{s^2 + (\Delta + w_o)^2}{s^2 + \frac{1}{2} K a^2 b^2 s + (\Delta + w_o)^2} \cdot \quad (7)$$

$$\frac{s^2 + (\Delta - w_o)^2}{s^2 + \frac{1}{2} K a^2 b^2 s + (\Delta - w_o)^2}$$

In other words, the filtered output transfer functions describe a dual notch filter at the frequencies $(w_o + \Delta)$ and $|w_o - \Delta|$. The two 3 db-bandwidths are approximately constant:

$$BW \approx \frac{1}{2} K a^2 b^2 \text{ rad/s} \quad (8)$$

and independent of frequency.

Inequality (6) is equivalent to:

$$BW << [2(w_o^2 + \Delta^2)]^{\frac{1}{2}} \quad (9)$$

which describes the (narrowness of) half-power-bandwidth with respect to the considered frequencies $w_o$, $\Delta$.

Moreover, when the filter bandwidths are narrow compared to using $Y = Z - E$ and equation (7) yields:

$$\frac{Y(s)}{Z(s)} \approx \frac{\frac{1}{2} K a^2 b^2 s}{s^2 + \frac{1}{2} K a^2 b^2 s + (\Delta + w_o)^2} + \quad (10)$$

$$\frac{\frac{1}{2} K a^2 b^2 s}{s^2 + \frac{1}{2} K a^2 b^2 s + (\Delta - w_o)^2}$$

Figure 1C:
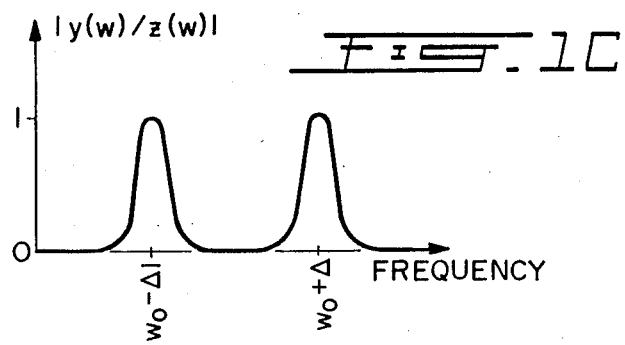
FIG. 1c is a graph illustrating the transfer function spectrum of the enhanced output signal.

FIGS. 1b and 1c are diagrams illustrating the frequency spectrum of the two transfer functions E(w)/Z(w) and Y(w)/Z(w).

Finally, it is pointed out that the integrator output signals $P_1$ to $P_4$ (see FIG. 1a) can be used to obtain amplitude/phase information of the interfering sinusoidal signals.

By referring now to FIG. 2a, there is illustrated, in block form, a symmetric quadruple frequency adaptive filter using only three specified frequencies: $\Delta$, $w_o$ and $w_c$. It is assumed that the input signal z(t) contains four undesired sinusoidal signals of respective frequencies $(w_c + w_o + \Delta)$, $(w_c + |w_o - \Delta|)$, $(w_c - |w_o - \Delta|)$ and $(w_c - w_o - \Delta)$. It is assumed further that the carrier frequency $w_c$ is much bigger than $w_o$ and $\Delta$.

The quadruple adaptive filter system of FIG. 2a comprises essentially a combiner 201 and a quadruple frequency adaptive enhancer 210. Comparing the two circuits of FIGS. 1a and 2a, the generalization in the quadruple system is quite obvious. The quadruple frequency adaptive enhancer 210 consists of an amplifier 211, four multipliers 212, 213, 214 and 215, an adder 216 and two identical circuit blocks 220a and 220b. The amplifier 211 is used to adjust the gain of the control loop. The dimension of the amplifier gain K is also expressed in radians·second$^{-1}$·volt$^{-6}$.

The two multipliers 212 and 213 are used for demodulating the amplified error signal e(t). Frequency conversions are made by using a pair of phase/quadrature signals c·cos ($w_c t + \phi$) and c·sin ($w_c t + \phi$). The amplitude c is expressed in volts, and the phase $\phi$ is expressed in radians.

It is pointed out that the two circuit blocks 220a and 220b are identical in construction to the circuit blocks 120a and 120b in FIG. 1a with the exception of the amplifier 111. Thus, the functioning of the circuits 220a and 220b are identical to those described with respect to the circuits 120a and 120b.

Referring again to FIG. 2a, the two multipliers 214 and 215 modulate respectively the output signals 217 and 218 from the respective circuit blocks 220a and 220b. The modulated carrier frequencies are respectively c·cos ($w_c t + \phi$) and c·sin ($w_c t + \phi$). The adder circuit 216 combines the modulated signals to give an enhanced output signal y(t) which signal is fed as a negative feedback signal to combiner 201.

The derivation of the symmetric quadruple frequency adaptive filter transfer function is very lengthy, but can be expressed by the following mathematical representation:

$$\frac{E(s)}{Z(s)} = \frac{\frac{4}{\pi} \sum_{i=1}^{4} (s^2 + w_{ni}^2)}{\sum_{j=1}^{8} d_j s^j} \tag{11}$$

Figure 2B:
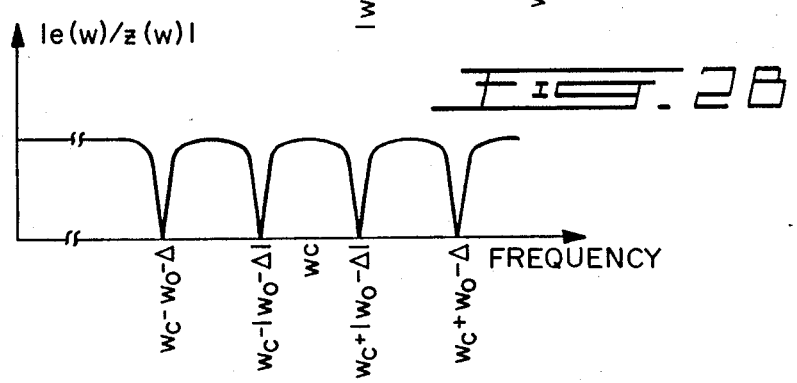

In this formula, the notch frequencies $w_{ni}$ are illustrated graphically in FIG. 2b and can be expressed as follows:

$$w_{n1} = w_c + w_o + \Delta$$
$$w_{n2} = w_c + w_o - \Delta$$
$$w_{n3} = w_c - w_o + \Delta$$
$$w_{n4} = w_c - w_o + \Delta \tag{12}$$

Further the denominator coefficients of the formula (11) are as follows:

$$d_8 = 1$$
$$d_7 = G = K a^2 b^2 c^2$$
$$d_6 = 4(w_c^2 + w_o^2 + \Delta^2)$$
$$d_5 = 3 G d_6 / 4$$
$$d_4 = 2[3(w_c^4 + w_o^4 + \Delta^4) + 2(w_c^2 w_o^2 + w_c^2 \Delta^2 + w_o^2 \Delta^2)]$$
$$d_3 = G d_4 / 2$$
$$d_2 =$$
$$4[(w_c^6 + w_o^6 + \Delta^6) - \Delta^4(w_o^2 + w_c^2) - w_c^4(w_o^2 + \Delta^2) - w_o^4(w_c^2 + \Delta^2)]$$
$$d_1 = G d_2 / 4$$
$$d_0 = (w_c + w_o + \Delta)^2 (w_c + w_o - \Delta)^2 (w_c - w_o + \Delta)^2 (w_c - w_o - \Delta)^2 \tag{13}$$

It is quite evident that the stability of the system answers to the norms established by Routh-Hurwitz, if $w_c \gg w_o$ and $\Delta$.

Furthermore, when $$\tfrac{1}{4} G \ll \tfrac{1}{2}(w_c - w_o - \Delta), \tag{14}$$

equation (11) can be factorized to:

$$\frac{E(s)}{Z(s)} = \frac{4}{\pi} \sum_{i=1}^{4} \frac{s^2 + w_{ni}^2}{s^2 + \tfrac{1}{4} G s + w_{ni}^2} \tag{15}$$

This last equation (15) demonstrates that the filtered output transfer function describes a quadruple notch filter in which the half-power-bandwidths are constant and independent of frequency, as is indicated by the following mathematical expression:

$$BW \approx \tfrac{1}{4} G = \tfrac{1}{4} K a^2 b^2 c^2 \text{ rad/s} \tag{16}$$

Figure 2C:
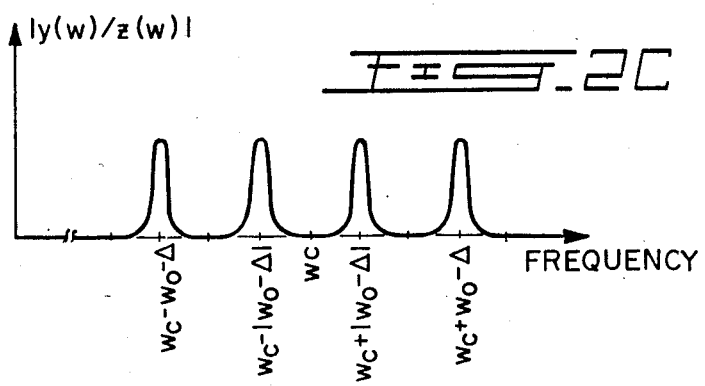

Furthermore, when the filter bandwidths are very narrow, as shown in equation (15), it can be seen that:

$$\frac{Y(s)}{Z(s)} = \sum_{i=1}^{4} \frac{\tfrac{1}{4} G s}{s^2 + \tfrac{1}{4} G s + w_{ni}^2} \tag{17}$$

i.e. the enhanced output y(t) gives a replica of considered sinusoidal signals extracted from the broadband input signal z(t). The FIGS. 2b and 2c illustrate graphically, the two transfer function spectrum $|E(w)/Z(w)|$ and $|Y(w)/Z(w)|$.

In many practical applications, it may be necessary to introduce some filters in the loop. Thus, FIG. 3 describes optional filter positions in a dual frequency adaptive filter. Thus, filter 311 may be inserted at the output of the amplifier 111 for attenuating all spectrum components other than ($w_o + \Delta$) or $|w_o - \Delta|$. Also, immediately following the multipliers 112 and 113, respectively, two identical filters 321 and 322 are centered on frequency $w_o$ and serve to eliminate as much as possible all input spectrum components other than $w_o$. These filters 321 and 322 enhance system performance in some cases and permit the use of ring modulators/switches as multipliers in the following blocks 120.

Identical filters 323 and 324 are connected at the output of the respective block circuits 120 to eliminate the undesired harmonics due to multiplier non-linearity. Filter circuit 312 is connected to the output of the combiner 116 and is used for the same purpose in removing all possible correlated components, other than ($w_o + \Delta$) or $|w_o - \Delta|$, generated by multipliers 114 and 115.

It is pointed out that these filters are optional and that the filter phases may affect the stability of the system.

Referring now to FIG. 4, filters can equally be optionally inserted in the quadruple adaptive filter system previously described. Filters 421 and 422 are usually bandpass filters centered on signal $w_c$ and having $2(w_o + \Delta)$ as the minimum bandwidth. The other filters, namely filters 311, 312, 321, 322, 323 and 324 have been previously described. The two blocks 420a and 420b are identical to the blocks 310a and 310b in FIG. 3 with the exception of the provision of amplifier 111.

Figure 5:
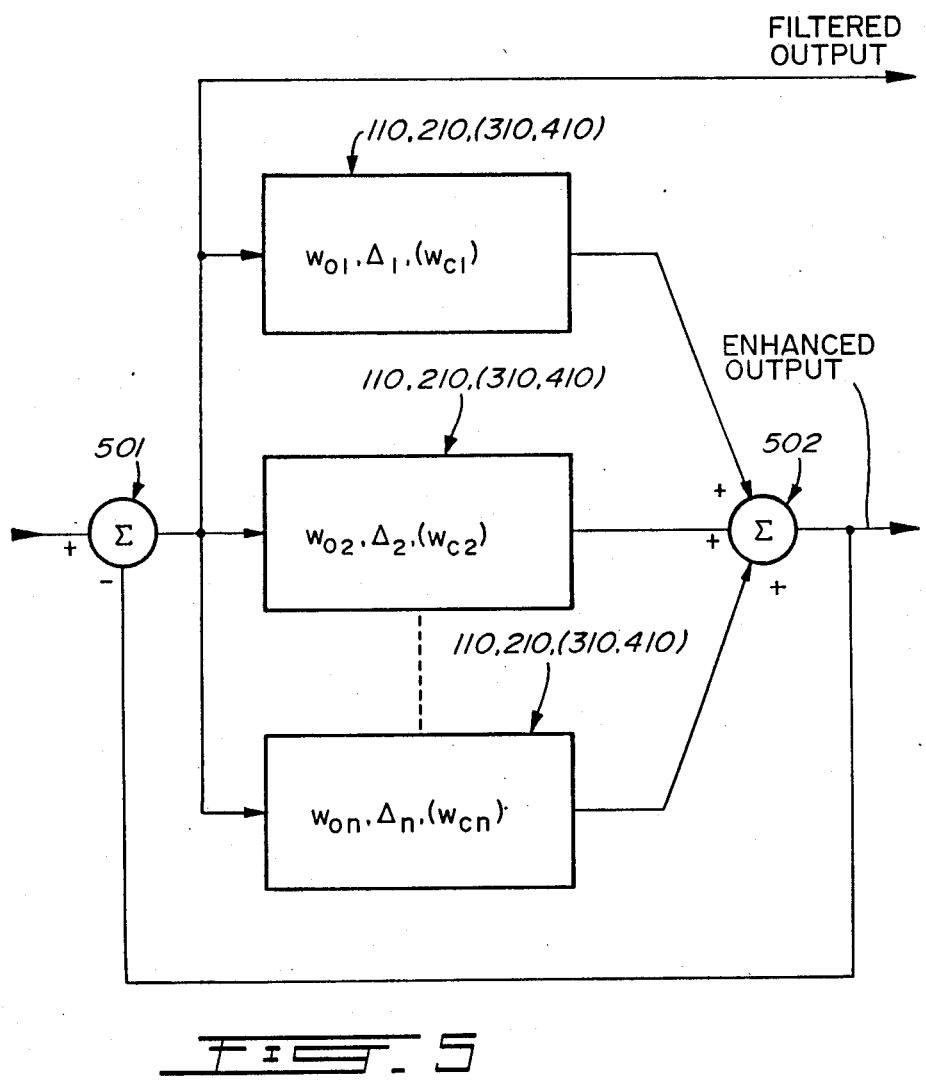
FIG. 5 is a block diagram illustrating the parallel interconnection of a plurality of adaptive filter systems to remove many interference signals combined with a desired input signal.

FIGS. 1a and 3, as well as FIGS. 2a and 4, illustrates various circuit configurations for a dual frequency adaptive filter and quadruple frequency adaptive filter and these devices may be combined in series and/or parallel form for multiple sinusoidal interference. For example, FIG. 5 illustrates a plurality of adaptive filters in parallel connection. This configuration requires a combiner 501 for negative feedback, an adder 502 for enhanced interference output and a certain number of blocks previously defined, 110/210 for the dual function adaptive filter or 310/410 for the symmetric quadruple frequency adaptive filter.

In order to minimize co-channel video interference, it is a requirement of video transmitting stations that they operate with carrier frequencies which are offset by 10 kHz above or below the nominal carrier frequencies. However, in many practical situations, the co-channel interference effect at the receiver is still harmful. Referring now to FIG. 6, a video co-channel adaptive filter, using the proposed configuration, is schematically illustrated.

As shown in FIG. 6, the video co-channel adaptive filter consists of phase-lock loop 630, frequency synthesizer 640, combiners 601, 602 and adaptive filters 650 and 660, respectively, for luminance and chrominance parts. The input signal (the wanted video + the co-channel interference) is applied to combiner 601 and the phase-lock loop 630. The phase-lock loop 630 has a two-fold purpose and namely to track the carrier beat frequency $\Delta$, and to generate synchronous signals a·cos $(\Delta t + \theta)$ and a·sin $(\Delta t + \theta)$.

The carrier beat frequency $\Delta$ can be changed from $(2\pi 8)$ to $(2\pi 12)$krad/s or from $(2\pi 18)$ to $(2\pi 22)$krad/s per second according to carrier frequencies.

Frequency synthesizer system 640, accepts the wanted video input signal and generates various synchronous signals concerning color subcarrier $w_c$, video line frequency $w_h$ and its multiples. These signals, namely c·cos $(w_c t + \theta)$, c·sin $(w_c t + \theta)$, b·cos $w_h t$, b·sin $w_h t$, . . . , are necessary for proposed algorithms.

The luminance circuit designated by reference numeral 650 consists of an amplifier $K_1$ 651 and a block circuit 620. In this block circuit 620, there are, in parallel, two multipliers 621 and 622, two identical blocks 610 followed respectively by two multipliers 623 and 624 and finally a combiner circuit 625. Multiplier circuits 621 and 622 are used for shifting interfering components to standard frequency positions at 0, $w_h$, $2w_h$, . . . , $nw_h$. Identical circuit blocks 610 which follow the multipliers 621 and 622, are used to enhance the interferential components, integrator 611 for DC (i.e. carrier beat) component, and each of n parallel blocks 120 or 320 previously described with reference to FIGS. 1a or 3a for each of other components, $w_h$, . . . , $nw_h$. The integrator output and the outputs from blocks 120/320 are added together in the combiner circuit 612. Multipliers 623 and 624, at the combiner outputs, function to modulate interfering components to their true frequency positions. Finally, the outputs of multipliers 623 and 624 are added together in the combiner circuit 625.

The chrominance circuit 660 consists of an amplifier $K_c$ 661, two bandpass filters 662 and 668 centered on the signal $w_c$ and two demodulators 663, 664, two identical circuit blocks 620, previously described, two color modulators 665 and 666 and a combiner circuit 667.

In the present circuit just briefly described, it has been shown through experimentation that the notch filter bandwidth should be 200 Hz for negligible video degradation. Also, for signal-to-interference-ratios at the input of about 20 db, parameter n in the luminance part should be 15 and in the chrominance part n should be 5.

It is within the ambit of the present invention to cover any obvious modifications of the examples of the preferred embodiment hereinabove described, provided such modifications fall within the scope of the appended claims.

I claim:

1. A multiple frequency adaptive filter system for filtering an input signal containing at least two sinusoidal interference signals contained in the same frequency band, said system comprising a negative feedback circuit having a narrow band-pass transfer function and generating an enhanced output signal corresponding to the interference signals contained in said input; said enhanced output signal being connected to an adder circuit at an input of said filter system where said input signal is combined with said enhanced output signal to produce an error signal feeding said negative feedback circuit, said error signal corresponds to the said input signal, said negative feedback circuit having a pair of multiplier circuits for conditioning said error signal in phase/quadrature, each of said multiplier circuits being connected to a respective conditioning circuit, and a combining circuit for adding the signals generated respectively by the conditioning circuits, said combining circuit generating said enhanced output signal, said conditioning circuit having at least a pair of demodulating means for demodulating the output signal of its associated multiplier circuit, each of said demodulating means being connected to a respective integration means to determine the amplitude of a respective demodulated signal at the output of said demodulating means, at least a pair of modulating means for modulating said demodulated signal at the output of said integration means, and adder means for adding said respective modulated signal at the output of said respective integration means from each said modulating means, said adder means feeding multiplier means, said multiplier means of each conditioning circuit feeding said combiner circuit to generate said enhanced signal.

2. A filter system as claimed in claim 1, wherein a variable gain amplifier is connected between said adder circuit and said pair of multiplier circuits.

3. A filter system as claimed in claim 1, wherein there are four of said interference signals and wherein said negative feedback circuit comprises two pairs of said multiplier circuits, a first pair for demodulating said error signal, each multiplier circuit of said first pair feeding respective signal paths comprising a further pair of multiplier circuits, each of said further pair of multiplier circuits placing said demodulated error signal in phase/quadrature and being connected to respective conditioning circuits in phase/quadrature and; said combining circuit comprising a first combining circuit adding said signals generated respectively by each of the conditioning circuits in said respective signal path, and a second combining circuit adding the signal generated by all said first combiner circuits to generate said enhanced output signal.

4. A filter system as claimed in claim 3, wherein each of said conditioning circuits comprises at least a pair of demodulating means to demodulate said error signal in phase/quadrature to provide a demodulated error signal, each of said demodulating means being connected to a respective integration means to determine the amplitude of a respective demodulated error signal, at least a pair of modulating means for modulating said demodulated signal at the output of said integration means, adder means for adding said modulated signal, said adder means feeding multiplier means, said multiplier means of each of said conditioning circuits feeding said first combining circuit.

5. A filter system as claimed in claim 3 wherein an adjustable gain amplifier is connected between said adder circuit and said first pair of multiplier circuits.

6. A filter system as claimed in claim 3, wherein filtration means is connected at the input and output of each of said conditioning circuits to remove all undesirable harmonics and wherein a filter is connected to the output of each of the first and second combining circuits to remove all correlation signal from said enhanced signal.

7. A filter system as claimed in claim 1, wherein filter means is connected at the input and output of each conditioning circuit in order to remove all undesirable harmonics and wherein a filter is connected to the output of said combining circuit to remove all correlation signals present in said enhanced signal.

8. A filter system as claimed in claim 1, wherein there is a plurality of said interference signals and wherein said negative feedback circuit includes a plurality of pairs of parallel connected multiplier circuits, there being a pair of said multiplier circuits for each interference signal present in said input signal, each pair of multiplier circuits being connected to a conditioning circuit which generates an output signal which is connected to a combining circuit which generates said enhanced output signal.

9. A filter system as claimed in claim 1, wherein said interference signals are TV co-channel signals.

10. A multiple frequency adaptive filter system for filtering an input signal containing four sinusoidal interference signals contained in the same frequency band, said system comprising a negative feedback circuit having a narrow band-pass transfer function and generating an enhanced output signal corresponding to the interference signals contained in said input; said enhanced output signal being connected to an adder circuit at an input of said filter system where said input signal is combined with said enhanced output signal to produce an error signal feeding said negative feedback circuit, said error signal corresponds to the said input signal, said negative feedback circuit having a first pair of multiplier circuits for demodulating said error signal, each multiplier circuit feeding respective signal paths comprising a further pair of multiplier circuits, each of said further pair of multiplier circuits placing said demodulated error signal in phase/quadrature and being connected to respective conditioning circuits in phase/quadrature; and a first combining circuit adding said signals generated respectively by each of the conditioning circuits in said respective signal path, and a second combining circuit adding the signal generated by all said first combiner circuits to generate said enhanced output signal.

11. A multiple frequency adaptive filter system for filtering an input signal containing at least two sinusoidal interference signals contained in the same frequency band, said system comprising a negative feedback circuit having a narrow band-pass transfer function and generating an enhanced output signal corresponding to the interference signals contained in said input; said enhanced output signal being connected to an adder circuit at an input of said filter system where said input signal is combined with said enhanced output signal to produce an error signal feeding said negative feedback circuit, said error signal corresponds to the said input signal, said negative feedback circuit comprises a pair of multiplier circuits for conditioning said error signal in phase/quadrature, each of said multiplier circuits being connected to a respective conditioning circuit, and a combining circuit for adding the signals generated respectively by the conditioning circuits, said combining circuit generating said enhanced output signal, and filter means connected at the input and output of each conditioning circuit in order to remove all undesirable harmonics and wherein a filter is connected to the output of said combining circuit to remove all correlation signals present in said enhanced signal.

12. A multiple frequency adaptive filter system for filtering an input signal containing a plurality of sinusoidal interference signals contained in the same frequency band, said system comprising a negative feedback circuit having a narrow band-pass transfer function and generating an enhanced output signal corresponding to the interference signals contained in said input; said enhanced output signal being connected to an adder circuit at an input of said filter system where said input signal is combined with said enhanced output signal to produce an error signal feeding said negative feedback circuit, said error signal corresponds to the said input signal, wherein said negative feedback circuit includes a plurality of pairs of parallel connected multiplier circuits, there being a pair of said multiplier circuits for each interference signal present in said input signal, each pair of multiplier circuits being connected to a conditioning circuit which generates an output signal which is connected to a combining circuit which generates said enhanced output signal.

* * * * *